US012666768B2

(12) United States Patent
Liu et al.

(10) Patent No.: US 12,666,768 B2
(45) Date of Patent: Jun. 23, 2026

(54) LED LIGHTING BASE, LED LIGHTING BEAD, AND LED LIGHTING STRIP

(71) Applicant: GUANGDONG OPSCO TECHNOLOGY CO., LTD., Dongguan (CN)

(72) Inventors: Mingjian Liu, Dongguan (CN); Gengsheng Zhu, Dongguan (CN); Zhenlei Wu, Dongguan (CN); Kai Zhou, Dongguan (CN)

(73) Assignee: GUANGDONG OPSCO TECHNOLOGY CO., LTD, Dongguan (CN)

( * ) Notice: Subject to any disclaimer, the term of this patent is extended or adjusted under 35 U.S.C. 154(b) by 862 days.

(21) Appl. No.: 18/064,935

(22) Filed: Dec. 13, 2022

(65) Prior Publication Data

US 2023/0115068 A1 Apr. 13, 2023

Related U.S. Application Data

(63) Continuation of application No. PCT/CN2021/126835, filed on Oct. 27, 2021.

(30) Foreign Application Priority Data

Sep. 22, 2021 (CN) .......................... 202122300363.5

(51) Int. Cl.
H10H 20/85 (2025.01)
H10D 87/00 (2026.01)
(Continued)

(52) U.S. Cl.
CPC ........ H10H 20/8506 (2025.01); H10D 87/00 (2025.01); H10H 20/854 (2025.01); H10H 29/142 (2025.01)

(58) Field of Classification Search
CPC .. H10D 87/00; H10H 20/8506; H10H 20/854; H10H 20/857; H10H 20/853;
(Continued)

(56) References Cited

U.S. PATENT DOCUMENTS

| | | | |
|---|---|---|---|
| 6,914,194 B2 * | 7/2005 | Fan | F21S 4/24 174/117 F |
| 2002/0066905 A1 * | 6/2002 | Wang | H10H 20/8506 257/433 |

(Continued)

FOREIGN PATENT DOCUMENTS

| | | |
|---|---|---|
| CN | 210956723 U | 7/2020 |
| CN | 213599119 U | 7/2021 |

OTHER PUBLICATIONS

International Search Report of PCT Patent Application No. PCT/CN2021/126835 issued on Mar. 29, 2022.

*Primary Examiner* — Mark W Tornow
*Assistant Examiner* — Priya M Rampersaud
(74) *Attorney, Agent, or Firm* — Andrew C. Cheng

(57) ABSTRACT

An LED lighting base includes an insulation housing and multiple conductive terminals fixed in the insulation housing by means of injection molding. The insulation housing is formed with a recessed compartment for receiving an LED chip assembly and an LED encapsulation resin disposed therein. Each of the conductive terminals includes a solder pad portion extending into the recessed compartment to electrically connect to the LED chip assembly and a pin portion exposed outside the insulation housing. Parts of the pin portions are grouped pairwise to form first pin pairs. One of the first pin pairs is arranged along a first trace and extends in a direction away from the insulation housing, remaining parts of the pin portions are arranged along a second trace. The first trace and the second trace intersect each other.

9 Claims, 9 Drawing Sheets

(51) Int. Cl.
H10H 20/854 (2025.01)
H10H 29/14 (2025.01)

(58) Field of Classification Search
CPC .... H10H 20/036; H10H 20/85; H10H 29/142;
H01R 12/67; H01R 4/2404; H01R
4/2406; H05K 2201/10287; H05K 3/32;
H05K 2201/0394; H05K 1/184; H05K
1/181; H05K 1/142; H05K 1/117; H05K
1/111; H05K 2201/10106; H05K
2203/049; H05K 3/0014; H05K 3/3426;
H05K 13/0465; H05K 3/303; F21K
9/238; F21K 9/235; F21V 23/06; F21S
4/24; F21S 43/195; H01L 2224/73265;
H01L 2224/81801; H01L 23/49861;
H01L 25/167; H10W 90/00; H10W
72/884
See application file for complete search history.

(56) References Cited

U.S. PATENT DOCUMENTS

| | | | |
|---|---|---|---|
| 2008/0283861 A1* | 11/2008 | Loh .................... | H10H 20/8506 257/E33.073 |
| 2009/0189174 A1* | 7/2009 | Lee .................... | H10H 20/8506 257/E33.058 |
| 2009/0230413 A1* | 9/2009 | Kobayakawa ....... | H10H 20/857 438/26 |
| 2011/0248293 A1* | 10/2011 | Chan .................... | H10H 20/857 257/E33.056 |
| 2012/0080711 A1* | 4/2012 | Kokubu .............. | H10H 20/857 257/E33.066 |
| 2012/0104436 A1* | 5/2012 | Ng ....................... | H10H 20/857 257/98 |
| 2013/0307013 A1* | 11/2013 | Chan .................... | H10W 90/00 257/E33.056 |
| 2014/0339595 A1* | 11/2014 | Kobayakawa ....... | H10H 20/857 257/99 |
| 2017/0098642 A1* | 4/2017 | Kobayakawa ......... | H10D 89/60 |

* cited by examiner

LED LIGHTING BASE, LED LIGHTING BEAD, AND LED LIGHTING STRIP

FIELD OF THE INVENTION

The application relates to the field of light-emitting diode (LED) technology, and more particularly to an LED lighting base, an LED lighting bead, and an LED lighting strip.

DESCRIPTION OF THE RELATED ART

With the booming of economics, light-emitting diodes (LEDs) have been evolved from lighting or indicating toward various applications including brand promotion, business advertisement, and city aesthetics. Specifically, a light-emitting diode and a driving chip are packaged, by means of LED encapsulation resin, in a mounting trough of an LED frame to form a lighting bead, and multiple such lighting beads are connected by means of a power line and a signal line to make a lighting strip. The signal line feeds in signals to control each of the lighting beads on the lighting strip to achieve various lighting effect. During courses of assembling and use, the power line and the signal line are directly soldered to corresponding pins. The signal line is then cut off at a portion between two pins to thereby form a signal input line and a signal output line. However, being constrained by the structure and size of the lighting beads, the soldering of the power line and the signal line may easily become pseudo soldering, and cutting the signal line may causes easy deformation and even damages, resulting in reduced reliability of the lighting beads and the lighting strip and this may cause risk of failure within the life spans thereof.

SUMMARY OF THE INVENTION

The purpose of the embodiments of the application is to provide a light-emitting diode (LED) lighting base, an LED lighting bead, and an LED lighting strip, aiming to overcome the problems that the traditional LED lighting base makes the reliability of the lighting bead and the lighting strip relatively poor in a fabrication process and readily becoming failure during the uses thereof.

A first objective of the application provides a technical solution as follows:

An LED lighting base comprises:

an insulation housing, the insulation housing being formed with a recessed compartment for receiving an LED chip assembly and an LED encapsulation resin therein;

multiple conductive terminals, the multiple conductive terminals being each fixed in the insulation housing by means of injection molding, each of the conductive terminals comprising a solder pad portion extending into the recessed compartment to electrically connect to the LED chip assembly and a pin portion exposed outside the insulation housing; at least parts of the pin portions being group pairwise to form a first pin pair;

at least one first pin pair arranged along the first trace and extending in a direction away from the insulation housing, remaining parts of the pin portions being arranged along the second trace, the first trace and the second trace intersecting each other.

In a feasible embodiment, the insulation housing comprises a first lateral end portion and a second lateral end portion opposite to the first lateral end portion; the first trace is a straight line connecting between the first lateral end portion and the second lateral end portion, the number of the first pin pair being one, the first pin pair extending from the first lateral end portion or the second lateral end portion in a direction away from the insulation housing;

or alternatively, the insulation housing comprises a first lateral end portion and a second lateral end portion opposite to the first lateral end portion; the first trace is a straight line connecting between the first lateral end portion and the second lateral end portion; the number of the first pin pair is two, in which one of the first pin pairs extends from the first lateral end portion is a direction away from the insulation housing, and another one of the first pin pairs extends from the second lateral end portion is a direction away from the insulation housing.

In a feasible embodiment, the two pin portions of the first pin pair arranged along the first trace each have a side wall surface, and the two side wall surface face each other, and from the first lateral end portion or the second lateral end portion toward an end away from the insulation housing, a distance between the two side wall surfaces is consistent or gradually increased.

In a feasible embodiment, the insulation housing is formed with an avoiding portion, and the avoiding portion is arranged between the two pin portions of a same first pin pair arranged along the first trace.

In a feasible embodiment, the insulation housing comprises a bottom end portion and a top end portion, and the avoiding portion is a notch extending from the bottom end portion to the top end portion, and the notch has an open end facing toward the first lateral end portion or the second lateral end portion.

In a feasible embodiment, an orthographic projection of the notch cast on the bottom end portion shows a polygonal opening or an arc opening, and an opening of the polygonal opening or the arc opening faces toward the first lateral end portion or the second lateral end portion;

or alternatively, the insulation housing comprises a first lateral end portion and a second lateral end portion opposite to the first lateral end portion, and the first trace is a straight line connecting between the first lateral end portion and the second lateral end portion; the notch comprises a first surface facing toward the first lateral end portion or the second lateral end portion, and the first surface extends, in such a manner that a distance from the first lateral end portion or the second lateral end portion is gradually decreased, from the bottom end portion in a direction toward the top end portion;

or alternatively, the insulation housing comprises a first lateral end portion and a second lateral end portion opposite to the first lateral end portion, and the first trace is a straight line connecting between the first lateral end portion and the second lateral end portion; the notch comprises a first surface a second surface, the first surface and the second surface are connected, and the first surface and the second surface both face toward the first lateral end portion or the second lateral end portion, and the first surface and the second surface are extended, in such a manner that a spacing distance is gradually increased, from a connected portion between the two toward the first lateral end portion or the second lateral end portion, and the connected portion of the first surface and the second surface is extended, in such a manner that a spacing distance from the first lateral end portion or the second lateral end portion is gradually decreased, in a direction toward the top end portion;

or alternatively, the insulation housing comprises a first lateral end portion and a second lateral end portion opposite to the first lateral end portion, and the first trace is a straight line connecting between the first lateral end portion and the second lateral end portion; the notch comprises a circular arc surface facing toward the first lateral end portion or the second lateral end portion, and a corresponding chord length of the circular arc surface is gradually decreased from the bottom end portion to the top end portion.

In a feasible embodiment, the first trace and the second trace perpendicularly intersect;

or, the first trace and the second trace are coplanar and perpendicularly intersect.

Compared to the prior art, in the LED lighting base provided in the embodiment of the application, in view that at least parts of the pin portions is grouped pairwise to form first pin pairs; at least one of the first pin pairs is arranged along a first trace and extends in a direction away from the insulation housing, while remaining parts of the pin portions are arranged along a second trace, and the first trace and the second trace intersect each other, in assembling into an LED lighting bead and an LED lighting strip, the LED lighting base helps reduce the risk of pseudo soldering and reduces risks of deformation of pin portions and even deformation of the LED lighting base and is advantageous in effectively enhancing reliability of the LED lighting bead and the LED lighting strip and extending service life.

A second objective of the application provides a technical solution as follows:

An LED lighting bead comprises:

the LED lighting base of the first aspect described above, one of the two pin portions of one of the first pin pairs arranged along the first trace being a signal input terminal, another being a signal output terminal;

an LED chip assembly, the LED chip assembly being mounted in the recessed compartment of the LED lighting base and electrically connected to the multiple solder pad portions;

an LED encapsulation resin, the LED encapsulation resin being filled in the recessed compartment and hermetically encapsulating the LED chip assembly.

In a feasible embodiment, the LED chip assembly comprises a driving chip and at least a kind of light-emitting chip, and the driving chip is electrically connected to the light-emitting chip.

A third objective of the application provides a technical solution as follows:

An LED lighting strip comprises:

at least two of the LED lighting beads described above; the at least two LED lighting beads being arranged at intervals along the second trace;

a conductive line assembly, the conductive line assembly comprising at least two signal lines, in which an end of one of the signal lines is connected to an external signal source and another end connected to the signal input terminal of one of the LED lighting beads to input a signal to the LED lighting bead; two adjacent LED lighting beads being connected by another one of the signal lines for cascade transmission of the signal between the LED lighting beads.

In a feasible embodiment, a spacing distance is present between the signal lines and the insulation housing;

and/or, the conductive line assembly further comprises a power line; the power line being electrically connected to the pin portion arranged along the second trace.

Compared to the prior art, in the LED lighting base provided in the embodiment of the application, in view that at least parts of the pin portions is grouped pairwise to form first pin pairs; at least one of the first pin pairs is arranged along a first trace and extends in a direction away from the insulation housing, while remaining parts of the pin portions are arranged along a second trace, and the first trace and the second trace intersect each other, in assembling into an LED lighting bead and an LED lighting strip, the LED lighting base helps reduce the risk of pseudo soldering and reduces risks of deformation of pin portions and even deformation of the LED lighting base and is advantageous in effectively enhancing reliability of the LED lighting bead and the LED lighting strip and extending service life.

Compared to the prior art, in the LED lighting bead provided in the embodiment of the application, in view that in the LED lighting base, at least parts of the pin portions is grouped pairwise to form first pin pairs; at least one of the first pin pairs is arranged along a first trace and extends in a direction away from the insulation housing, while remaining parts of the pin portions are arranged along a second trace, and the first trace and the second trace intersect each other, in assembling into an LED lighting strip, the LED lighting bead helps reduce the risk of pseudo soldering and reduces risks of deformation of pin portions and even deformation of the LED lighting base and is advantageous in effectively enhancing reliability of the LED lighting bead and the LED lighting strip and extending service life.

Compared to the prior art, in the LED lighting strip provided in the embodiment of the application, since the LED lighting beads that make up the LED lighting strip exhibit a low rate of pseudo soldering, being free of risks of deformation of the pin portions and deformation of the LED lighting base, the LED lighting strip demonstrates a relatively high reliability and an extended service life.

BRIEF DESCRIPTION OF THE DRAWINGS

To more clearly expound the technical solution of embodiments of the application, a brief description will be provided below for the drawings that are necessary for illustrating the embodiments. Obviously, the drawings described below are provided for some of the embodiments of the application, and based on such drawings, those having ordinary skill in the art may envisage other drawings without creative endeavor.

REFERENCE SIGNS OF THE DRAWINGS

10: LED lighting base;
11: insulation housing; 110: recessed compartment; 111: first lateral end portion; 1110: avoiding portion; 112: second lateral end portion; 113: top end portion; 114: bottom end portion;
12: conductive terminal; 120: first pin pair; 121: solder pad portion; 122: pin portion; 1220: side wall surface; 123: connection portion; 124: transition portion;
PQ: first trace;
RS: second trace;
20: LED lighting bead;
21: LED chip assembly; 211: driving chip; 212: light-emitting chip;
22: LED encapsulation resin;
30: LED lighting strip;
31: conductive line assembly; 311: signal line; 3110: stamp-cutting section; 312: power line.

DETAILED DESCRIPTION OF EMBODIMENTS

A clear and complete description of the technical solution provided in embodiments of the application is provided below with reference to the drawings of the embodiments of the application. Of course, the described embodiments are just some of the embodiments of the application, and are not all the embodiments thereof. Based on the embodiments of the application, those having ordinary skill in the art may, without paying creative endeavor, contemplate all the remaining embodiments, which all belong to the scope of protection of the application.

Embodiment I

The instant embodiment provides a light-emitting diode (LED) lighting base 10, an LED lighting bead 20, and an LED lighting strip 30, which, as well as structural diagrams of corresponding components, are illustrated in FIGS. 1-6.

Figure 1:
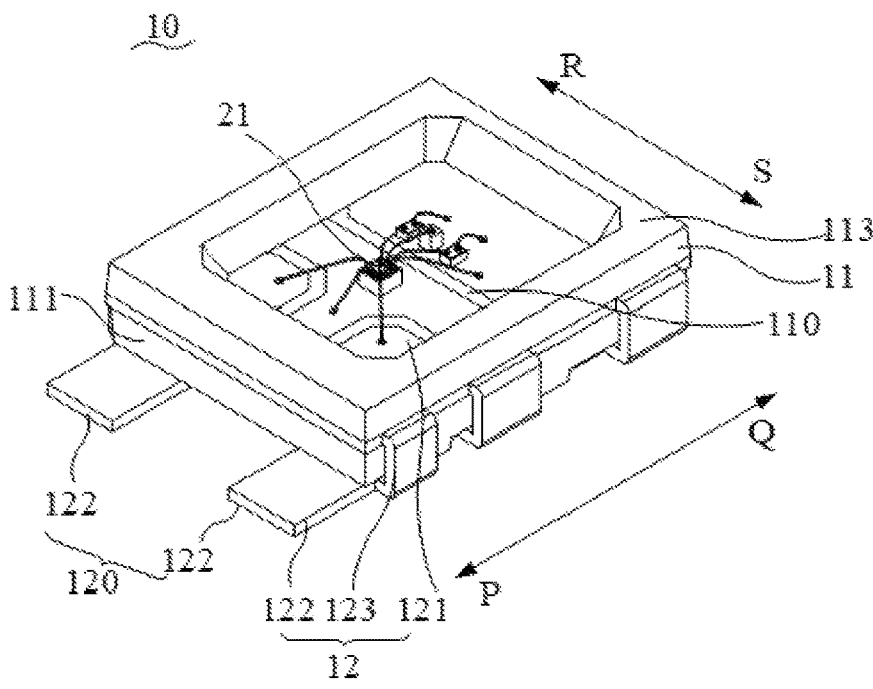
FIG. 1 is a schematic perspective view showing an LED lighting base according to a first embodiment of the application.
Figure 2:
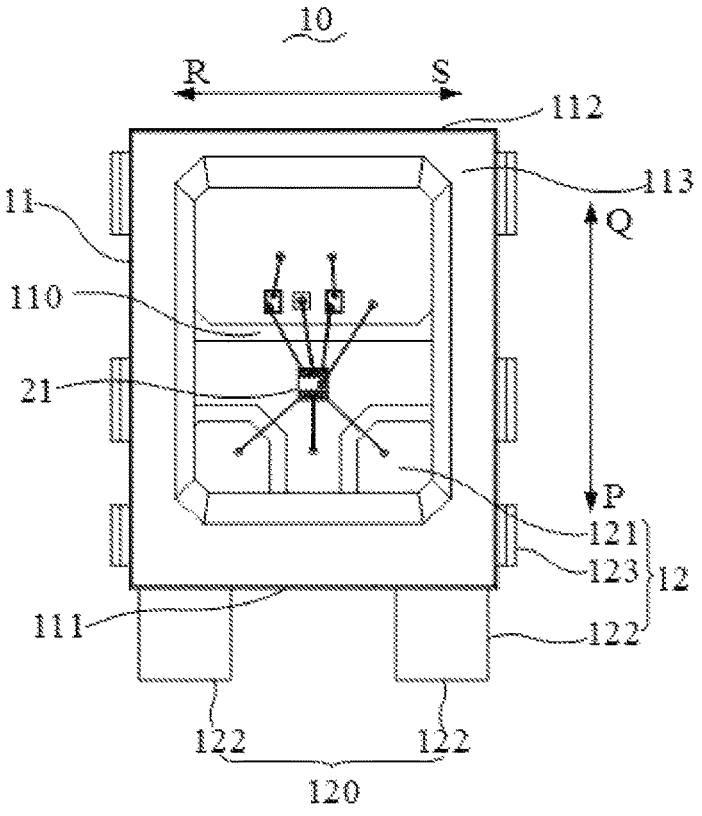
FIG. 2 is schematic top plan view showing the LED lighting base according to the first embodiment of the application.
Figure 3:
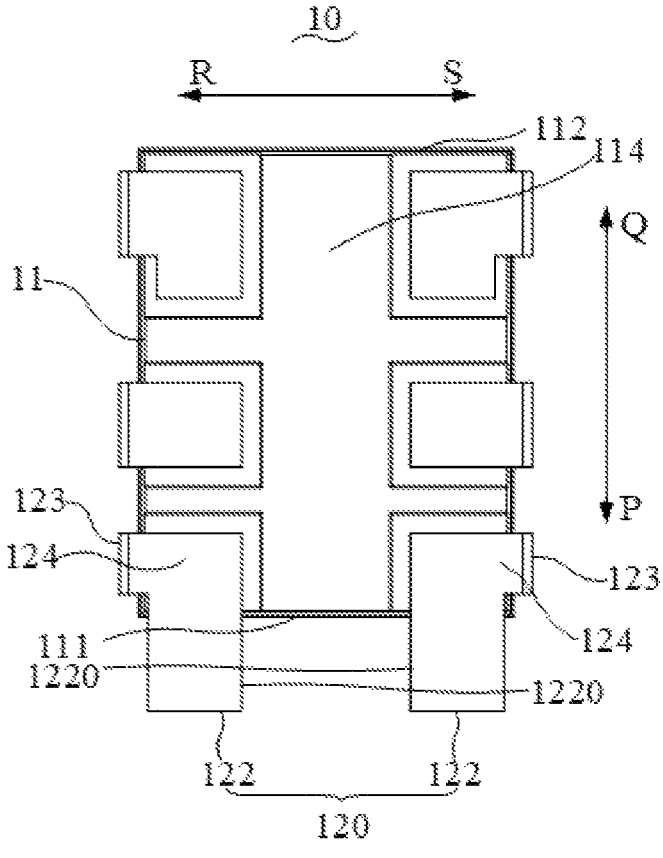
FIG. 3 is a schematic bottom view showing the LED lighting base according to the first embodiment of the application.

Referring to FIGS. 1, 2, and 3, the LED lighting base 10 according to the instant embodiment comprises an insulation housing 11 and multiple conductive terminals 12, wherein the insulation housing 11 is formed with a recessed compartment 110, and the recessed compartment 110 is configured to receive an LED chip assembly 21 and an LED encapsulation resindisposed therein. The multiple conductive terminals 12 are each fixed to the insulation housing 11 by means of injection molding, and each conductive terminal 12 has a solder pad portion 121 and a pin portion 122, and the solder pad portion 121 and the pin portion 122 are connected, wherein the solder pad portion 121 extends into the recessed compartment 110 to electrically connect to the LED chip assembly 21, and the pin portion 122 is exposed outside the insulation housing 11, and at least parts of the pin portions 122 are grouped pairwise and separated from each other to form first pin pairs 120; at least one first pin pair 120 is arranged along a first trace PQ and extends in a direction away from the insulation housing 11, and the remaining pin portions 122 are arranged along a second trace RS, and the first trace PQ and the second trace RS intersect each other. In the instant embodiment, on the one hand, due to one first pin pair 120 of the LED lighting base 10 being arranged along the first trace PQ and the first pin pair 120 extending in a direction away from the insulation housing 11, and the remaining pin portions 122 being arranged along the second trace RS, and the first trace PQ and the second trace RS intersecting each other, when conductive lines are soldered to the LED lighting base 10, all the conductive lines are extended along the second trace RS, and at least one conductive line is positioned against the two pin portions 122 of the first pin pairs 120 that is arranged along the first trace PQ, and the remaining conductive lines are positioned, along the second trace RS, against at least one pin portion 122, so as to facilitate soldering of the conductive lines to the pin portions 122 of the LED lighting base 10, thereby reducing the situations of open solder, pseudo soldering, or insecure soldering, and effectively enhancing the reliability of the soldering of the conductive lines. On the other hand, due to the one of the first pin pairs 120 that is arranged along the first trace PQ being extended in a direction away from the insulation housing 11, and spacing being presented between the two pin portions 122 of the one of the first pin pairs 120, stamp-cutting of the conductive lines soldered to the pin pair 120 that is arranged along the first trace PQ can be facilitated and the stamp-cutting process is not affected by the spatial structure of the LED lighting base 10, and no deformation of the LED lighting base 10 may occur, thereby effectively enhancing the reliability of stamp-cutting of the conductive lines and reducing the requirement for precision of stamp-cutting facility, both being beneficial for improving processing reliability of the LED lighting bead 20 and the LED lighting strip 30, increasing product passing rate and also helping increase reliability of the LED lighting bead 20 and the LED lighting strip 30 during the courses of use thereof.

Referring to FIGS. 1, 2, and 3, in some embodiments, the insulation housing 11 has a first lateral end portion 111, a second lateral end portion 112, a top end portion 113, and a bottom end portion 114, wherein the first lateral end portion 111 and the second lateral end portion 112 are arranged opposite to each other, and the top end portion 113 and the bottom end portion 114 are arranged opposite to each other. The first trace PQ is a straight line connecting between the first lateral end portion 111 and the second lateral end portion 112, and one of the first pin pairs 120 is arranged along the first trace PQ, and the first pin pair 120 that is arranged along the first trace PQ is extended from the first lateral end portion 111 or the second lateral end portion 112 in a direction away from the insulation housing 11. In such a way of embodiment, only one first pin pair 120 is arranged along the first trace PQ, and for the LED lighting base 10 so obtained, in making the LED lighting bead 20 and the LED lighting strip 30, during a soldering process, it only needs to apply stamp-cutting to the conductive line that is soldered to the first pin pair 120 arranged along the first trace PQ in order to cut off the conductive line connected between the two pin portions 122 of the first pin pair 120 arranged along the first trace PQ.

Referring to FIGS. 1, 2, and 3, in some embodiments, the first trace PQ and the second trace RS perpendicularly intersect. For the structural arrangement that the first trace PQ and the second trace RS perpendicularly intersect, meaning the first pin pair 120 that is arranged along the first trace PQ and the pin portion 122 that is arranged along the second trace RS are perpendicular to each other, when multiple conductive lines are arranged along the second trace RS, the conductive line that spans across the first pin pair 120 arranged along the first trace PQ is perpendicular to the first pin portions 122 arranged along the first trace PQ, so as to facilitate the soldering between the conductive line and the first pin pair 120, and also facilitate subsequent stamp-cutting of the conductive line spanning across the first pin pair 120 arranged along the first trace PQ to effectively reduce the tensile stress generated in the two pin portions 122 of the first pin pair 120 resulting from stamp-cutting of the conductive line and preventing the stamp-cutting of the conductive line from inducing deformation of the pin portion 122. In some embodiments, the first trace PQ and the second trace RS are coplanar and perpendicularly intersect, and this is advantageous for positioning and processing of multiple conductive lines along the second trace RS, and enhancing reliability of processing.

Referring to FIGS. 1, 2, and 3, in the instant embodiment, the multiple conductive terminals 12 are fixed in the insulation housing 11 by means of injection molding, specifically, insert molding. A specific process of insert molding is to place the multiple conductive terminals 12 that have been prepared in advance into a mold, where the conductive terminals 12 are made of a metallic material, such as copper, and then, resin is injected into the mold, so that the molten resin is solidified on and combined with the conductive terminals 12. In some embodiments, the resin can be a thermoplastic resin, including any one of polyphthalamide (PPA), poly 1,4-cyclohexylene dimethylene terephthalate (PCT), polyethylene terephthalate (PET), and polybutylene terephthalate (PBT). The moldability and flexibility of the thermoplastic resin and the stiffness, strength, and heat resistance of the metal are complemental to each other to thereby make the LED lighting base 10 that is complicated in structure and delicate. Such an LED lighting base 10 exhibits the insulation property of resin and the electrically conductive property of metal, and can effectively satisfy the requirement for electrical performance of the LED lighting base 10.

Referring to FIGS. 1, 2, and 3, in some embodiments, each conductive terminal 12 further comprises a connection portion 123, and connection between the solder pad portion 121 and the pin portion 122 is achieved with the connection portion 123. In some embodiments, the connection portion 123 is arranged in a direction from the top end portion 113 to the bottom end portion 114, while the pin portion 122 is partly exposed on the bottom end portion 114. Such a structural arrangement helps improve the reliability of the conductive terminal 12 and the insulation housing 11. In some embodiments, the solder pad portion 121, the pin portion 122, and the connection portion 123 in each conductive terminal 12 are integrally formed together.

Referring to FIGS. 1, 2, and 3, in some embodiments, spacing is present between the multiple conductive terminals 12, in order to eliminate electrical connection therebetween that results in shorting. The pin portions 122 that are arranged along the second trace RS are also grouped together two by two to be spaced from each other and form pairs for electrically connecting to conductive lines of a power line 312 and a grounding line.

Referring to FIGS. 3 and 2, in some embodiments, the conductive terminals 12 that comprise the first pin pair 120 arranged along the first trace PQ further comprise a transition portion 124. The transition portion 124 connects between the pin portion 122 and the connection portion 123, and by means of the transition portion 124, the reliability of the conductive terminals 12 in the insulation housing 11 is effectively enhanced. In some embodiments, the transition portion 124 is positioned against the bottom end portion 114 and has an end extended toward the first lateral end portion 111 or the second lateral end 112 to connect to the pin portion 122, and a part of an edge thereof being connected to the connection portion 123, so as to enhance the reliability of stamp-cutting on the first pin pair 120 arranged along the first trace PQ. In some embodiments, the solder pad portion 121, the connection portion 123, the transition portion 124, and the pin portion 122 of the conductive terminals 12 are integrally formed together, meaning the solder pad portion 121 of the conductive terminals 12 extends from the recessed compartment 110 in a direction toward a lateral end portion of the insulation housing 11 and bends at the lateral end portion of the insulation housing 11 in a direction toward the bottom end portion 114 to form the connection portion 123, and the connection portion 123 bends at an interfacing site between the lateral end portion and the bottom end portion 114 to extend along the second trace RS to form the transition portion 124, and the transition portion 124 is positioned against the bottom end portion 114, and an end of the transition portion 124 extends along the first trace PQ toward the first lateral end portion 111 or the second lateral end portion 112 to form the pin portion 122.

Referring to FIGS. 3 and 2, in some embodiments, the two pin portions 122 of the first pin pair 120 arranged along the first trace PQ each have a side wall surface 1220, and the two side wall surfaces 1220 face toward each other, and from the first lateral end portion 111 or the second lateral end portion 112 toward an end away from the insulation housing 11, the spacing distance between the two side wall surfaces 1220 is consistent.

Referring to FIGS. 4 and 1-3, based on the above-described LED lighting base 10, the instant embodiment further provides an LED lighting bead 20.

Specifically, the LED lighting bead 20 comprises an LED lighting base 10, an LED chip assembly 21, and an LED encapsulation resin 22, wherein the first pin pair 120 arranged along the first trace PQ comprises two pin portions 122, of which one pin portion 122 is a signal input terminal and another pin portion 122 is a signal output terminal; and the multiple pin portions 122 arranged along the second trace RS may comprise a power input terminal, a power output terminal, and a grounding terminal. The LED chip assembly 21 is mounted in the recessed compartment 110 of the LED lighting base 10, and is electrically connected to the plurality of solder pad portions 121. The LED encapsulation resin 22 is filled in the recessed compartment 110 and hermetically encapsulates the LED chip assembly 21. In the instant embodiment, the LED lighting bead 20 comprises the first pin pair 120 arranged along the first trace PQ, and one pin portion 122 of the first pin pair 120 is the signal input terminal and another pin portion 122 is the signal output terminal, so as to ease cascade connection of a plurality of LED lighting beads 20.

It is noted that in the instant embodiment, in an application of serial connection of n (n≥2) LED lighting beads 20, an external signal source feeds signals through the signal line 311 into the first LED lighting bead 20. The first LED lighting bead 20 and the second LED lighting bead 20 are connected to each other with the signal line 311 therebetween, so that the signals fed into the first LED lighting bead 20 are transmitted toward the second LED lighting bead 20; the second LED lighting bead 20 and the third LED lighting bead 20 are connected to each other with the signal line 311 therebetween, so that the signals fed to the second LED lighting bead 20 are transmitted toward the third LED lighting bead 20; . . . ; the (n−1)th LED lighting bead 20 and the nth LED lighting bead 20 are connected to each other with the signal line 311 therebetween, so that the signals fed to the (n−1)th LED lighting bead 20 are transmitted toward the nth LED lighting bead 20; and the plurality of LED lighting beads 20 are connected to each other and transmit signals to each other in such a pattern, this being the cascade connection.

Figure 4:
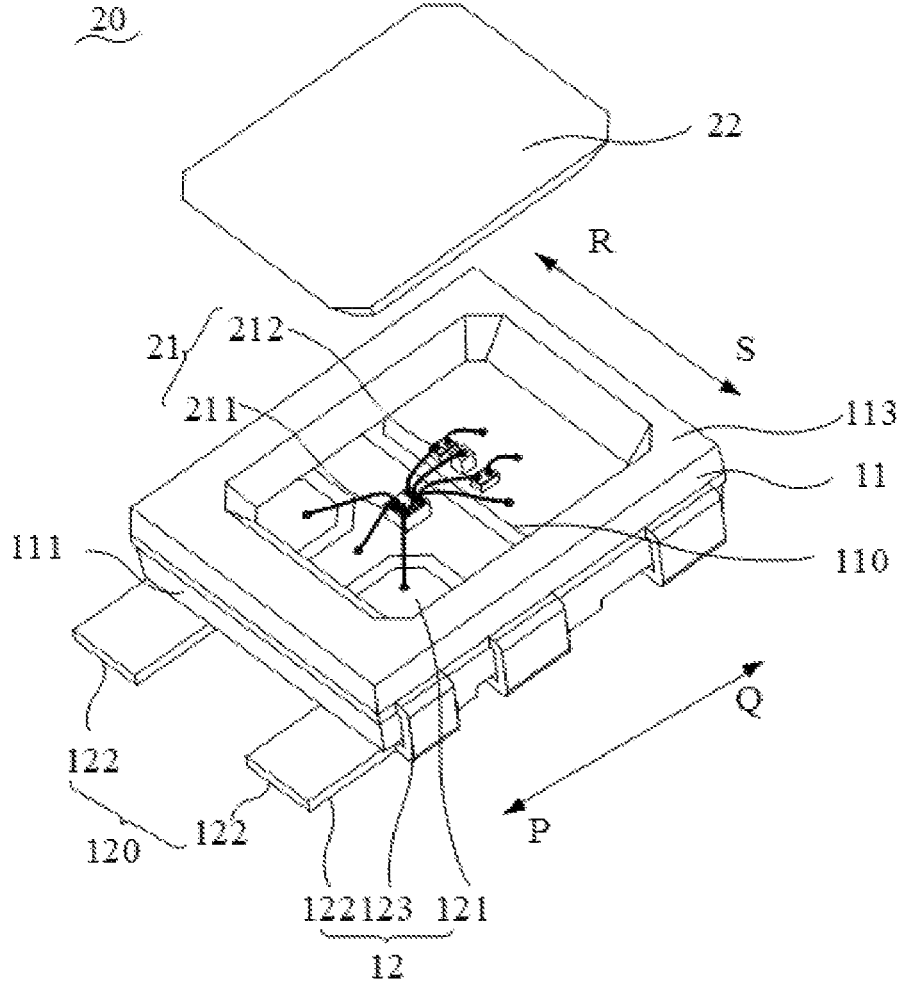
FIG. 4 is schematic perspective view showing an LED lighting bead according to the first embodiment of the application.

Referring to FIG. 4, in some embodiments, the LED chip assembly 21 comprises a driving chip 211 and at least one kind of light-emitting chip 212. The driving chip 211 is electrically connected to the light-emitting chip 212. In some embodiments, the driving chip 211 is an integrated circuit (IC) chip, and the driving chip 211 is connected to the signal input terminal and the signal output terminal. In some embodiments, the light-emitting chip 212 comprises a blue-light LED chip, a green-light LED chip, a red-light LED chip, a white-light LED chip. Specifically, the number of the light-emitting chips 212 and the kinds of the light-emitting chips 212 can be selected according to the scenario of application to thereby realize different effects of lighting.

Referring to FIG. 4, in some embodiments, the driving chip 211 is electrically connected to the solder pad portions 121 by means of bonding lines (not labeled in the drawings), and the light-emitting chip 212 is electrically connected to the solder pad portions 121 by means of bonding lines, and the driving chip 211 and the light-emitting chip 212 are connected to each other with bonding lines. Specifically, the bonding line comprises a gold line, a copper line, a palladium-plated copper line, and an alloy line.

Figure 5:
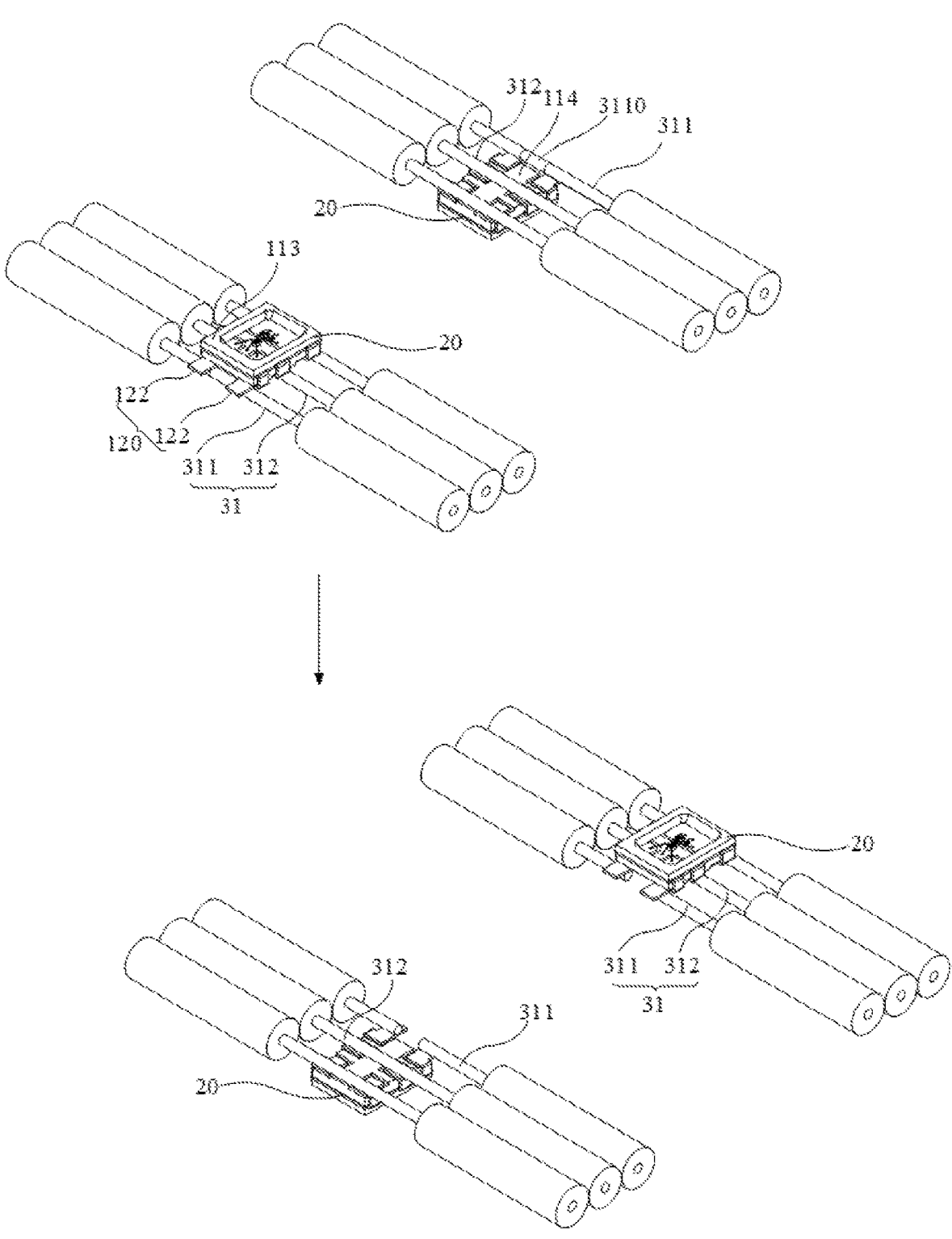
FIG. 5 is a schematic view showing a manufacturing process for an LED lighting strip according to the first embodiment of the application.
Figure 6:
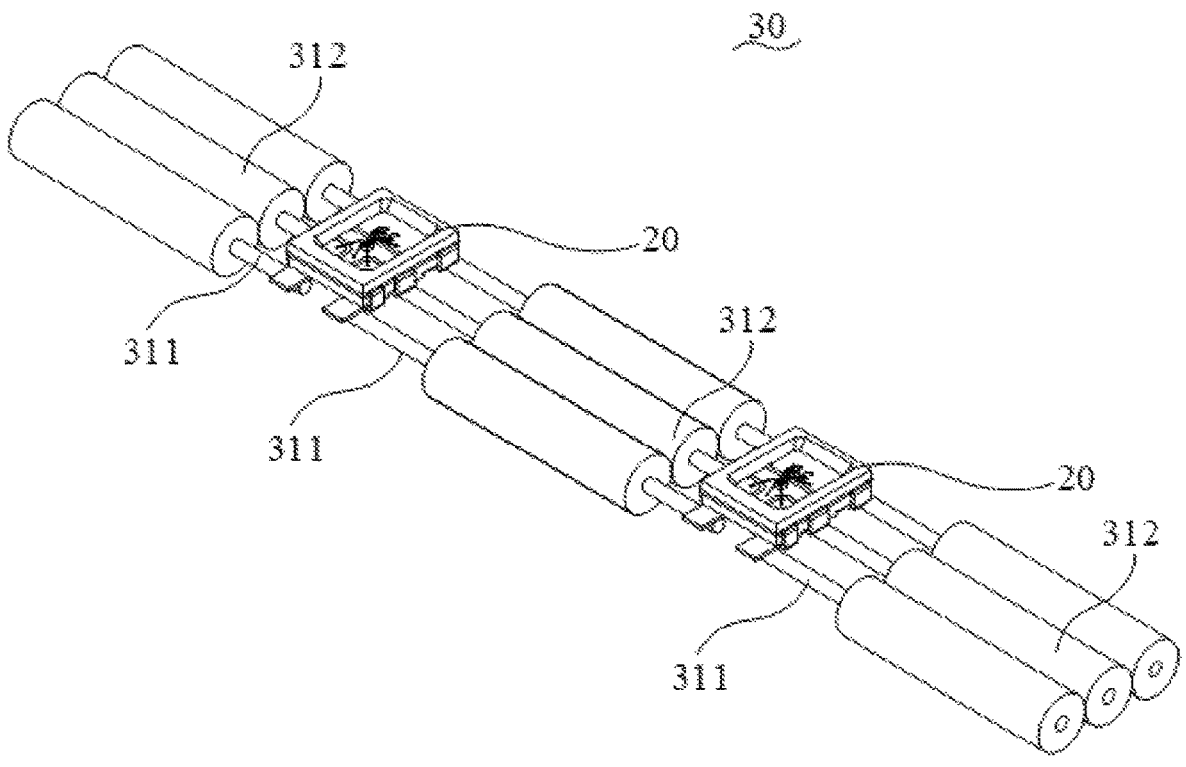
FIG. 6 is schematic perspective view showing an LED lighting strip according to the first embodiment of the application.
Figure 7:
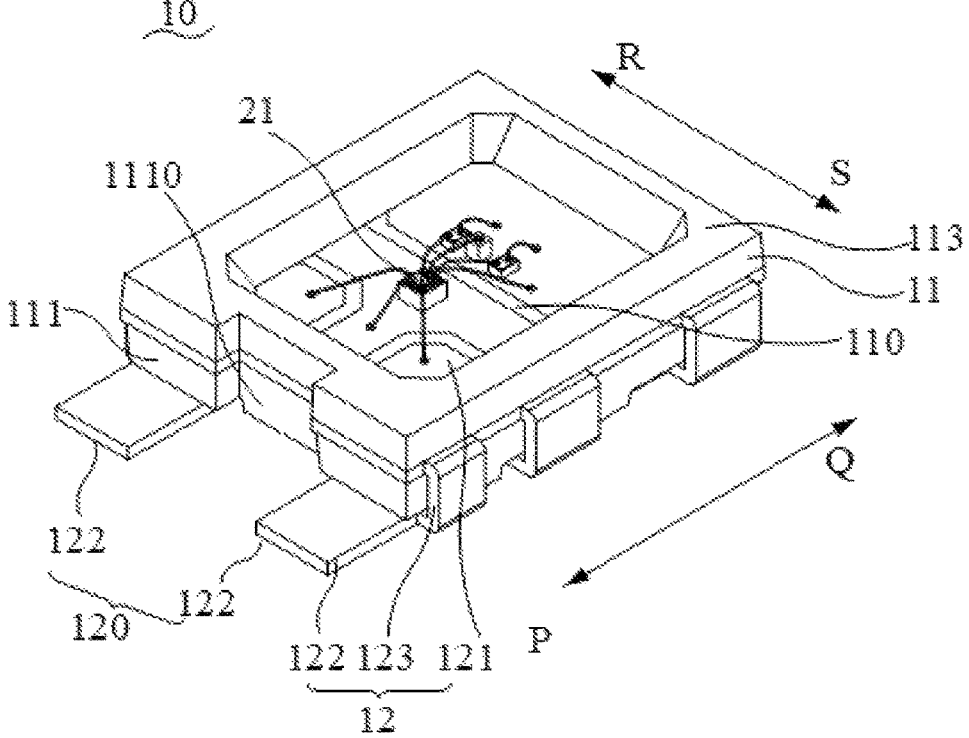
FIG. 7 is schematic perspective view showing an LED lighting base according to a second embodiment of the application.
Figure 8:
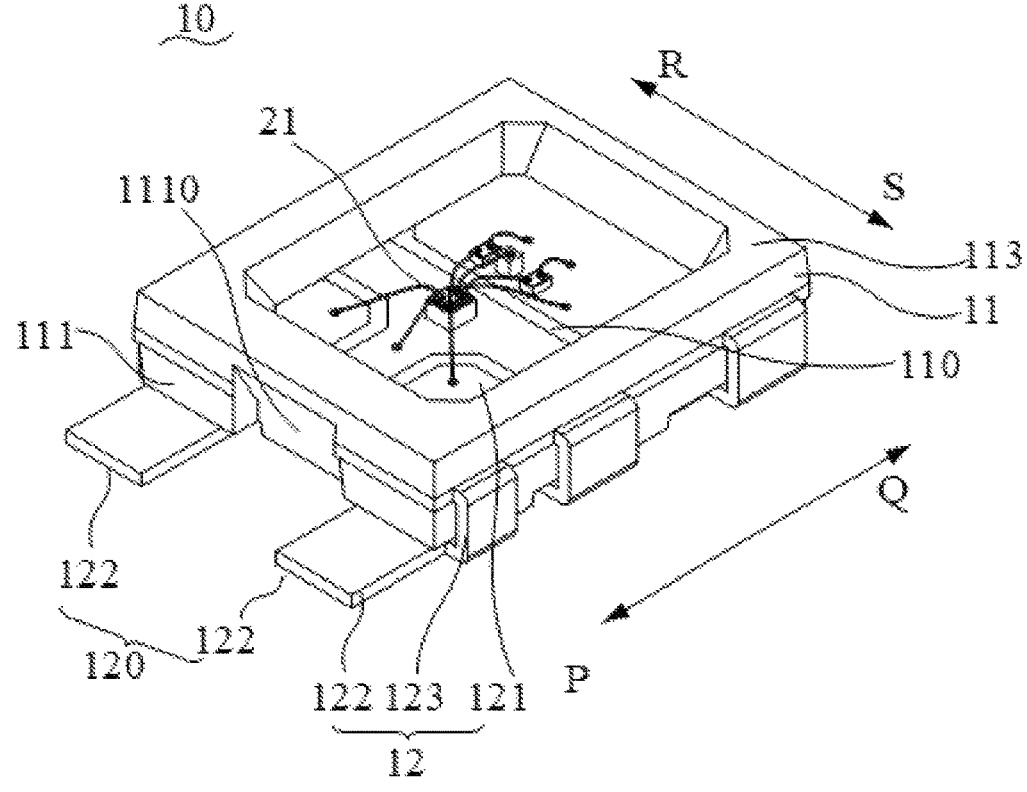
FIG. 8 is a schematic perspective view showing an LED lighting base according to a third embodiment of the application.
Figure 9:
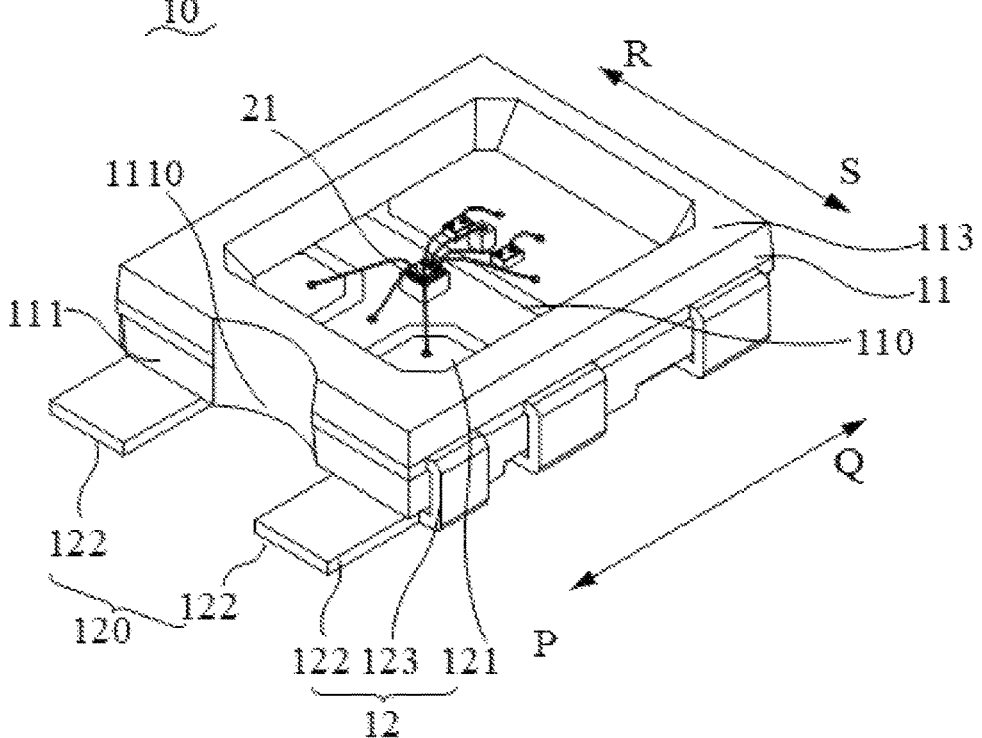
FIG. 9 is a schematic perspective view showing an LED lighting base according to a fourth embodiment of the application.
Figure 10:
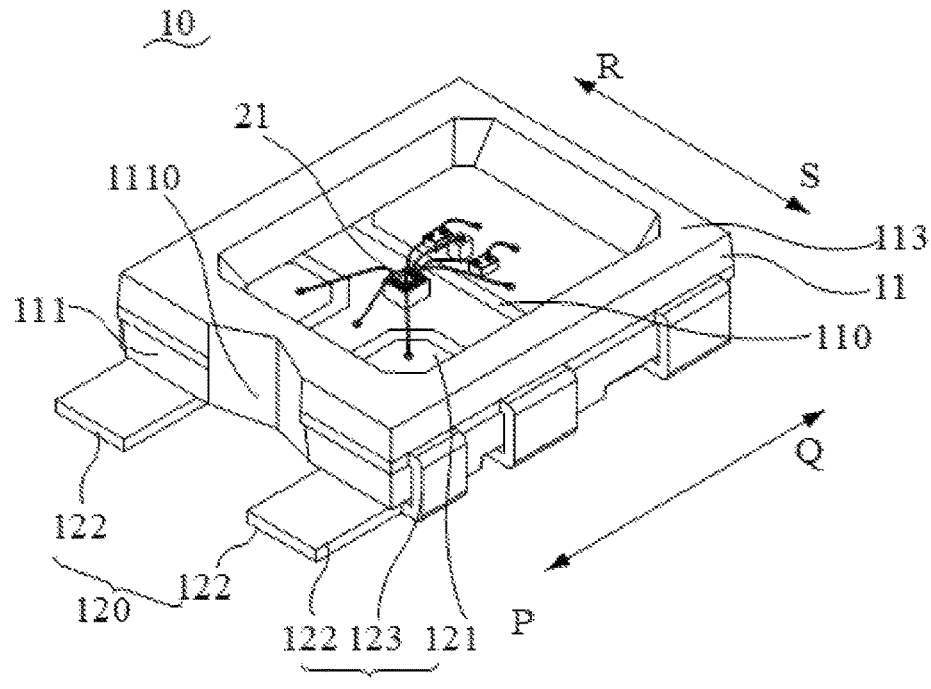
FIG. 10 is a schematic perspective view showing an LED lighting base according to a fifth embodiment of the application.
Figure 11:
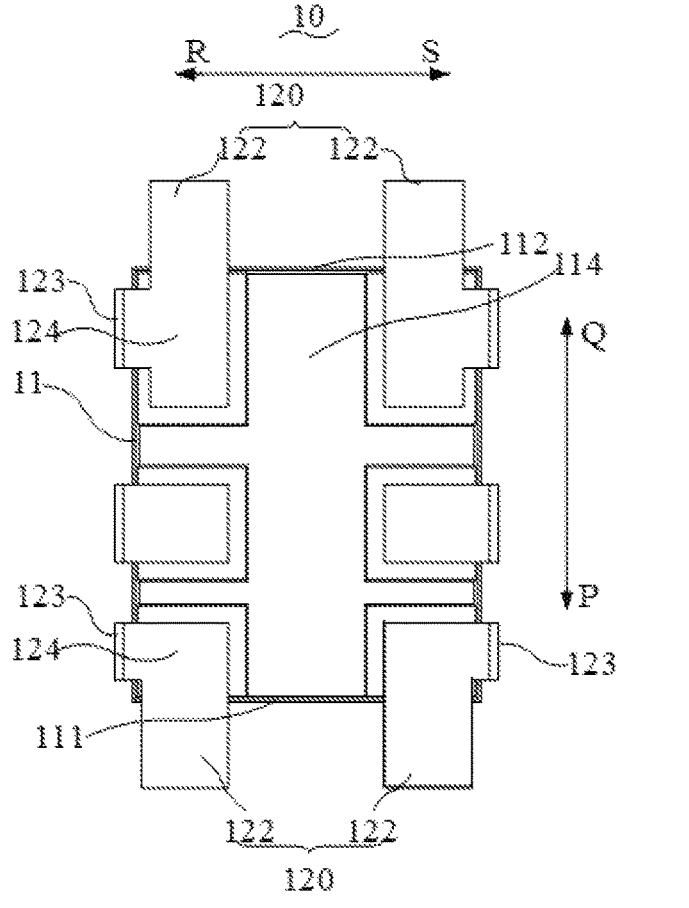
FIG. 11 is a schematic bottom view showing an LED lighting base according to a sixth embodiment of the application.

Referring to FIGS. 5, 6, and 4, based on the above-described LED lighting bead 20, the instant embodiment provides a method for manufacturing an LED lighting strip 30.

The manufacture of the LED lighting strip 30 involves the LED lighting bead 20 and a conductive line assembly 31. The conductive line assembly 31 comprises multiple conductive lines, and the conductive line is covered with a protective layer. To manufacture the LED lighting strip 30, it is necessary that a part of a core of the conductive line is made exposed for soldering, meaning the protective layer is first stripped off for subsequent soldering to each first pin pair 120 and the remaining pin portion 122, and then, after the soldering, a light guide resin structure is formed to enclose the part of the conductive line that lacks the insulation cover and each pin and soldering spot. The conductive line assembly 31 comprises a material of copper wires, enameled copper wires, or silicone rubber copper wires.

(1) The conductive line assembly 31 is subjected to stripping of the protective layer, so that a wire core of the conductive line assembly 31 is partially exposed, and the exposed part of the conductive line assembly 31 corresponds to a soldering portion of LED lighting beads 20.

(2) At least two LED lighting beads 20 are arranged at intervals along the second trace RS on the conductive line assembly 31, and the first pin pair 120 of the LED lighting bead 20 is positioned across one conductive line, while the remaining pin portions 122 are positioned across another conductive line, and then soldering is implemented to have each conductive line correspondingly soldered to one first pin pair 120 and the remaining conductive lines correspondingly soldered to one pin portion 122 or two pin portions 122, and after the soldering is completed, the conductive line that is soldered to the first pin pair 120 arranged along the first trace PQ forms a stamp-cutting portion 3110 between the two pin portions 122 of the first pin pair 120.

(3) The conductive line assembly 31 and the LED lighting beads 20 are turned over by 180°, so that the conductive line assembly 31 faces upward and the LED lighting beads 20 face downward, meaning the top end portions 113 of the LED lighting beads 20 face downward and the bottom end portions 114 face upward, and then a stamp-cutting apparatus is applied to stamp and cut off the stamp-cutting portion 3110, and during the process of the stamp-cutting, the stamp-cutting apparatus is fed in a direction from the bottom end portion 114 toward the top end portion 113 to stamp and cut off the stamp-cutting portion 3110.

(4) Resin-dripping encapsulation is then conducted to enclose the exposed part of the conductive line assembly 31 and the part soldered to the LED lighting beads 20 for isolating from the outside to thereby obtain the LED lighting strip 30.

Referring to FIGS. 6 and 4, based on the above, the instant embodiment further provides an LED lighting strip 30.

Specifically, the LED lighting strip 30 comprises a conductive line assembly 31 and at least two LED lighting beads 20; the conductive line assembly 31 is arranged to extend along the second trace RS, and the at least two LED lighting beads 20 are arranged, at intervals, along the second trace RS, on the conductive line assembly 31; the conductive line assembly 31 comprises at least two signal lines 311, and an end of one of the signal lines 311 is connected to an external signal source, and another end is connected to an signal input terminal of one of the LED lighting beads 20 in order to input signals to the LED lighting bead 20; and two adjacent LED lighting beads 20 are connected to each other by another signal line 311 for cascade transmission of the signals between the at least two LED lighting beads 20.

Referring to FIGS. 6 and 4, in some embodiments, the signal line 311, after being soldered to the signal input terminal and the signal output terminal, has a spacing distance from the insulation housing 11.

Referring to FIGS. 6 and 4, the conductive line assembly 31 further comprises a power line 312; the power line 312 is electrically connected to the pin portion 122 arranged along the second trace RS. The conductive line assembly 31 further comprises a grounding line, and the grounding line is electrically connected to the pin portion 122 arranged along the second trace RS.

Referring to FIGS. 6 and 4, in an illustrative embodiment, the LED lighting strip 30 comprises two LED lighting beads 20, three signal lines 311, a power line 312, and a grounding line (not labeled in the drawings). An end of a first signal line 311 is connected to an external signal source, and another end connected to a signal input terminal of a first LED lighting bead 20; an end of a second signal line 311 is connected to a signal output terminal of the first LED lighting bead 20, and another end is connected to a signal input terminal of a second LED lighting bead 20; an end of a third signal line 311 is connected to a signal output terminal of the second LED lighting bead 20, and the power line 312 serially connects the first LED lighting bead 20 and the second LED lighting bead 20, and the grounding line grounds the first LED lighting bead 20 and the second LED lighting bead 20 separately. To use, a control instruction issues an instruction that is fed along the first signal line 311 to the first LED lighting bead 20, and the first LED lighting bead 20, after receiving the instruction issued to the first LED lighting bead 20, drives the light-emitting chip 212 of the first LED lighting bead 20 to emit light, and simultaneously, an instruction transmitted to the second LED lighting bead 20 is fed along the second signal line 311 to the second LED lighting bead 20 and is received by the second LED lighting bead 20 to drive the light-emitting chip 212 of the second LED lighting bead 20 to emit light. Of course, this provides just illustration of a portion of the LED lighting strip 30, and the LED lighting strip 30 may be serially connected with more LED lighting beads 20, such as a signal input terminal of a third LED lighting bead 20 being connected to a third signal line 311, additional LED lighting beads 20 being arranged at intervals along the second trace RS by following such a connection pattern to thereby achieve more effect of lighting.

Embodiment 2

Referring to FIG. 7 and FIGS. 1-6, an LED lighting base 10, an LED lighting bead 20, and an LED lighting strip 30 provided in the instant embodiment are different from EMBODIMENT 1 mainly in respect of the structural differences described below:

For EMBODIMENT 1, in the structure of the LED lighting base 10, the insulation housing 11 is not formed with an avoiding portion 1110. Instead, in the instant embodiment, the insulation housing 11 is formed with an avoiding portion 1110. The avoiding portion 1110 is arranged between the two pin portions 122 of the first pin pair 120 arranged along the first trace PQ. By means of the arrangement of the avoiding portion 1110, during processing and manufacturing of the LED lighting bead 20 and the LED lighting strip 30, it can effectively avoid collision between a stamp-cutting apparatus and the insulation housing 11 that results in deformation, or even breaking, of the LED lighting base 10, and can also reduce the requirement for precision of the stamp-cutting apparatus.

In some embodiments, the avoiding portion 1110 is a notch extending from the bottom end portion 114 toward the top end portion 113. The notch has an open end that faces toward the first lateral end portion 111 or the second lateral end portion 112. Further, in some embodiments, an orthographic projection the notch cast on the bottom end portion 114 shows a polygonal opening or an arc opening, and the polygonal opening or the arc opening both face toward the first lateral end portion 111 or the second lateral end portion 112. Arranging the avoiding portion 1110 as a notch extending from the bottom end portion 114 toward the top end portion 113 is advantageous for the stamp-cutting apparatus to feed in a direction from the bottom end portion 114 toward the top end portion 113. In some embodiments, the polygonal opening comprises a rectangular opening, a triangular opening, or other polygonal shapes. In some embodiments, the arc opening comprises a circular arc opening or a semi-circular opening.

It is noted that the orthographic projection of the notch on the bottom end portion 114 is a projection that is formed on the plane on which the bottom end portion 114 is located by parallel projection lines perpendicular to the top end portion 113 and projecting toward the bottom end portion 114.

Except the structural arrangement solution described above being different from EMBODIMENT 1, the LED lighting base 10, the LED lighting bead 20 and the LED lighting strip 30 provided according to the instant EMBODIMENT 2 can all refer to the corresponding designs of EMBODIMENT 1, and to save page space, redundant description will be omitted herein.

Embodiment 3

Referring to FIGS. 8 and 7, and 1-6, an LED lighting base 10, an LED lighting bead 20, and an LED lighting strip 30 provided in the instant embodiment are different from EMBODIMENT 2 mainly in respect of the structural differences described below:

For EMBODIMENT 2, in the structure of the LED lighting base 10, the orthographic projection of the notch cast on the bottom end portion 114 is an orthographic projection having a shape of rectangle, or triangle, or circular arc. Instead, in the instant embodiment, the notch has a first surface facing toward the first lateral end portion 111 or the second lateral end portion 112, and the first surface extends from the bottom end portion 114, in a manner of gradually reducing a distance thereof from the first lateral end portion 111 or the second lateral end portion 112, toward the top end portion 113. Designing the notch with such a structure allows stamp-cutting to be achieved by controlling a feeding depth of the stamp-cutting apparatus, so as to save energy consumption and also to enhance accuracy of stamp-cutting. More importantly, it can ensure the structural strength of the LED lighting base 10, and also, inclusion of the presence of the avoiding portion 1110 does not need to modify the existing structure of the recessed compartment 110, and thus, adding the avoiding portion 1110 does not affect the original light-emitting effect of the LED lighting base 10.

Except the structural arrangement solution described above being different from EMBODIMENT 2, the LED lighting base 10, the LED lighting bead 20 and the LED lighting strip 30 provided according to the instant EMBODIMENT 3 can all refer to the corresponding designs of EMBODIMENT 2, and to save page space, redundant description will be omitted herein.

Embodiment 4

Referring to FIGS. 9, 7, and 1-6, an LED lighting base 10, an LED lighting bead 20, and an LED lighting strip 30 provided in the instant embodiment are different from EMBODIMENT 2 mainly in respect of the structural differences described below:

For EMBODIMENT 2, in the structure of the LED lighting base 10, the orthographic projection of the notch cast on the bottom end portion 114 is an orthographic projection showing a polygonal opening or an arc opening. Instead, in the instant embodiment, the notch has an arc surface facing toward the first lateral end portion 111 or the second lateral end portion 112, and a corresponding chord length of the arc surface gradually reduces from the bottom end portion 114 toward the top end portion 113, meaning an arc cross section is obtained by intercepting the notch in a direction perpendicular to a direction from the bottom end portion 114 toward the top end portion 113, and in a direction from the bottom end portion 114 toward the top end portion 113, the chord length of the arc cross section is gradually reduced. Designing the notch with such a structure allows the outside of the stamp-cutting apparatus to be designed as a conic structure, where a stamp-cutting point is an apex of the cone, so that a contact area between the stamp-cutting apparatus and the conductive line can be reduced to achieve a bettered effect of stamping with a stamping force obtained with a reduced stamping surface. Meanwhile, it can ensure the structural strength of the LED lighting base 10, and also, inclusion of the presence of the avoiding portion 1110 does not need to modify the existing structure of the recessed compartment 110, and thus, adding the avoiding portion 1110 does not affect the original light-emitting effect of the LED lighting base 10.

Except the structural arrangement solution described above being different from EMBODIMENT 2, the LED lighting base 10, the LED lighting bead 20 and the LED lighting strip 30 provided according to the instant EMBODI-MENT 4 can all refer to the corresponding designs of EMBODIMENT 2, and to save page space, redundant description will be omitted herein.

Embodiment 5

Referring to FIGS. 10, 7, and 1-6, an LED lighting base 10, an LED lighting bead 20, and an LED lighting strip 30 provided in the instant embodiment are different from EMBODIMENT 2 mainly in respect of the structural dif-ferences described below:

For EMBODIMENT 2, in the structure of the LED lighting base 10, the orthographic projection of the notch cast on the bottom end portion 114 is an orthographic projection having a shape of rectangle, or triangle, or circular arc. Instead, in the instant embodiment, the notch has a first surface and a second surface, and the first surface and the second surface face toward the first lateral end portion 111 or the second lateral end portion 112, and the first surface and the second surface are connected, and the first surface and the second surface are extended, in a manner of a spacing distance being gradually increased, from a connected portion between the two toward the first lateral end portion 111 or the second lateral end portion 112, and the connected portion of the first surface and the second surface is extended, in a manner that a distance from the first lateral end portion 111 or the second lateral end portion 112 is gradually reduced, toward the top end portion 113. Mean-while, it can ensure the structural strength of the LED lighting base 10, and also, inclusion of the presence of the avoiding portion 1110 does not need to modify the existing structure of the recessed compartment 110, and thus, adding the avoiding portion 1110 does not affect the original light-emitting effect of the LED lighting base 10.

Except the structural arrangement solution described above being different from EMBODIMENT 2, the LED lighting base 10, the LED lighting bead 20 and the LED lighting strip 30 provided according to the instant EMBODI-MENT 5 can all refer to the corresponding designs of EMBODIMENT 2, and to save page space, redundant description will be omitted herein.

Embodiment 6

Referring to FIGS. 11 and 1-6, an LED lighting base 10, an LED lighting bead 20, and an LED lighting strip 30 provided in the instant embodiment are different from EMBODIMENT 1 mainly in respect of the structural dif-ferences described below:

For EMBODIMENT 1, in the structure of the LED lighting base 10, the number of the first pin pair 120 arranged along the first trace PQ is just one. Instead, in the instant embodiment, the number of the first pin pairs 120 arranged along the first trace PQ is two, in which one of first pin pairs 120 is extended from the first lateral end portion 111 in a direction away from the insulation housing 11, and another one of the first pin pairs 120 is extended from the second lateral end portion 112 in a direction away from the insulation housing 11. Such a structural design is applicable to an LED lighting strip 30 that requires stamp-cutting applied to two conductive lines of a conductive line assem-bly 31.

Except the structural arrangement solution described above being different from EMBODIMENT 1, the LED lighting base 10, the LED lighting bead 20 and the LED lighting strip 30 provided according to the instant EMBODI-MENT 6 can all refer to the corresponding designs of EMBODIMENT 1, and to save page space, redundant description will be omitted herein.

Embodiment 7

Figure 12:
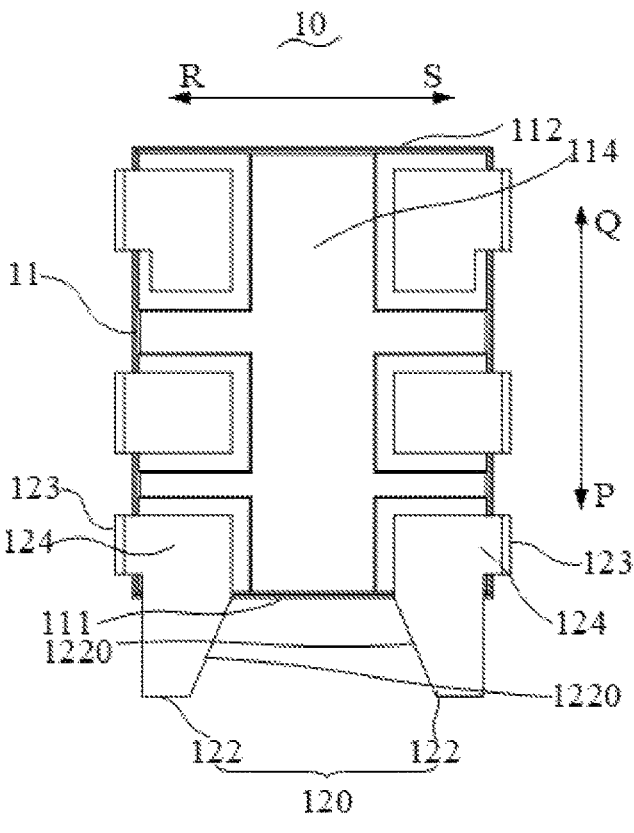
FIG. 12 is a schematic bottom view showing an LED lighting base according to an illustrative example of a seventh embodiment of the application.
Figure 13:
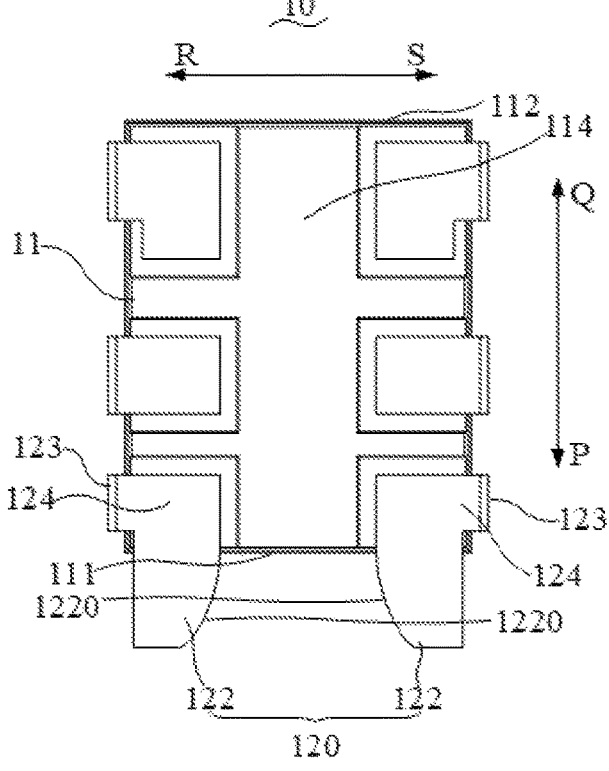
FIG. 13 is a schematic bottom view showing an LED lighting base according to another illustrative example of the seventh embodiment of the application.
Figure 14:
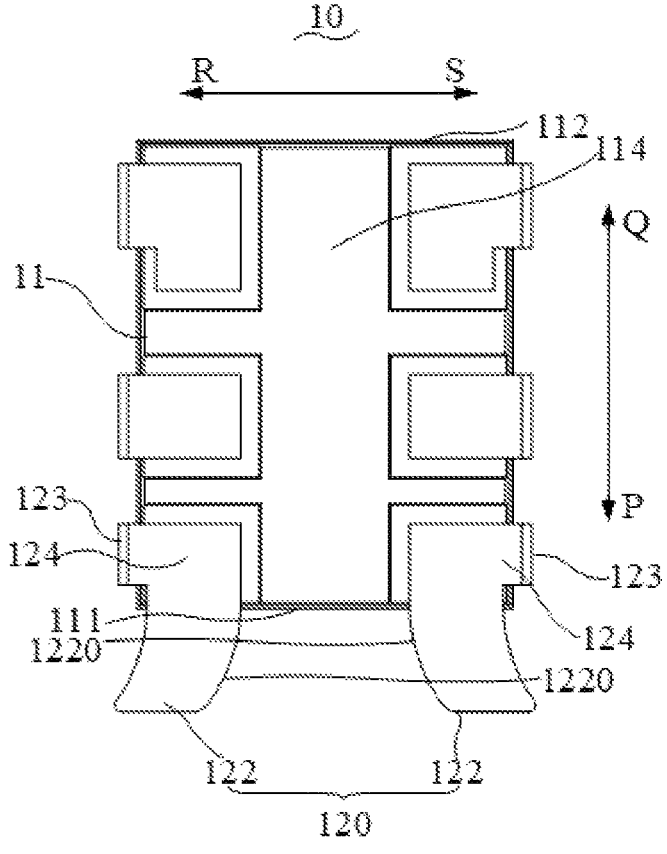
FIG. 14 is a schematic bottom view showing an LED lighting base according to a further illustrative example of the seventh embodiment of the application.

Referring to FIGS. 12, 13, 14, and 1-6, an LED lighting base 10, an LED lighting bead 20, and an LED lighting strip 30 provided in the instant embodiment are different from EMBODIMENT 1 mainly in respect of the structural dif-ferences described below:

In EMBODIMENT 1, the two pin portions 122 of the first pin pair 120 arranged along the first trace PQ each have a side wall surface 1220, and the side wall surfaces 1220 of the two pin portions 122 exactly face each other, and from the first lateral end portion 111 or the second lateral end portion 112 to an end away from the insulation housing 11, the distance between the two side wall surfaces 1220 is consis-tent. Instead, in the instant embodiment, from the first lateral end portion 111 or the second lateral end portion 112 toward an end away from the insulation housing 11, a distance between the two side wall surfaces 1220 is gradually increased, wherein the side wall surfaces 1220 shown in FIG. 12 are inclined flat surfaces from the first lateral end portion 111 to an end away from the insulation housing 11; the side wall surfaces 1220 shown in FIG. 13 are curved surfaces from the first lateral end portion 111 to an end away from the insulation housing 11; the side wall surfaces 1220 shown in FIG. 14 are curved surfaces, and the two pin portions 122 are arranged in a diverging form extending from the first lateral end portion 111 to an end away from the insulation housing 11. Such a structural design provides an excellent avoiding portion 1110 formed between the two pin portions 122 of the first pin pair 120 arranged along the first trace PQ, making it easy for a stamp-cutting apparatus to cut off a conductive line spanning between the two pin portions 122 of a pin pair 120. This ensures that no influence occurs on the LED lighting base 10 during the process of stamp-cutting, and since there is no need to modify the existing structure of the recessed compartment 110, it does not affect the original light-emitting effect of the LED lighting base 10; further, since the two pin portions 122 are arranged in a diverging configuration, a soldering area between the pin portion 122 and a conductive line (such as a signal line) does not reduce due to forming of the avoiding portion 1110, so as to ensure the reliability of soldering of the conductive line.

Except the structural arrangement solution described above being different from EMBODIMENT 1, the LED lighting base 10, the LED lighting bead 20 and the LED lighting strip 30 provided according to the instant EMBODIMENT 7 can all refer to the corresponding designs of EMBODIMENT 1, and to save page space, redundant description will be omitted herein.

The above illustrates only certain ways of implementation of the application. It is noted here that those having ordinary skill in the field may contemplate further modifications without departing from the inventive concept of the application, and such modifications are all considered falling with the scope of protection that the application pursues.

What is claimed is:

1. A light-emitting diode (LED) lighting base, characterized by comprising:

an insulation housing, the insulation housing being formed with a recessed compartment for receiving an LED chip assembly and an LED encapsulation resin therein;

multiple conductive terminals which are respectively fixed in the insulation housing by means of injection molding, each of the conductive terminals comprising a solder pad portion extending into the recessed compartment to electrically connect to the LED chip assembly and a pin portion exposed outside the insulation housing, at least parts of the pin portions being group pairwise to form a first pin pair; and at least one first pin pair being arranged along a first trace and extending in a direction away from the insulation housing, remaining parts of the pin portions being arranged along a second trace, the first trace and the second trace intersecting each other;

wherein the insulation housing is formed with an avoiding portion which is arranged between two pin portions of the first pin pair arranged along the first trace;

the insulation housing comprises a bottom end portion, a top end portion, a first lateral end portion and a second lateral end portion opposite to the first lateral end portion; and the avoiding portion is a notch extending from the bottom end portion to the top end portion, and the notch has an open end facing toward the first lateral end portion or the second lateral end portion.

2. The LED lighting base according to claim 1, characterized in that the insulation housing comprises a first lateral end portion and a second lateral end portion opposite to the first lateral end portion; the first trace is a straight line connecting between the first lateral end portion and the second lateral end portion, the number of the first pin pair being one, the first pin pair extending from the first lateral end portion or the second lateral end portion in a direction away from the insulation housing;

or alternatively, the insulation housing comprises a first lateral end portion and a second lateral end portion opposite to the first lateral end portion; the first trace is a straight line connecting between the first lateral end portion and the second lateral end portion; the number of the first pin pair is two, in which one of the first pin pairs extends from the first lateral end portion in a direction away from the insulation housing, and another one of the first pin pairs extends from the second lateral end portion in a direction away from the insulation housing.

3. The LED lighting base according to claim 2, characterized in that the two pin portions of the first pin pair arranged along the first trace each have a side wall surface, and the two side wall surfaces face each other, and from the first lateral end portion or the second lateral end portion toward an end away from the insulation housing, a distance between the two side wall surfaces is consistent or gradually increased.

4. The LED lighting base according to claim 1, characterized in that an orthographic projection of the notch cast on the bottom end portion shows a polygonal opening or an arc opening, and the polygonal opening or the arc opening faces toward the first lateral end portion or the second lateral end portion;

or alternatively, the first trace is a straight line connecting between the first lateral end portion and the second lateral end portion; the notch comprises a first surface facing toward the first lateral end portion or the second lateral end portion, and the first surface extends, in such a manner that a distance from the first lateral end portion or the second lateral end portion is gradually decreased, from the bottom end portion in a direction toward the top end portion;

or alternatively the first trace is a straight line connecting between the first lateral end portion and the second lateral end portion; the notch comprises a first surface a second surface, the first surface and the second surface are connected, and the first surface and the second surface both face toward the first lateral end portion or the second lateral end portion, and the first surface and the second surface are extended, in such a manner that a spacing distance therebetween is gradually increased, from a connected portion between the two toward the first lateral end portion or the second lateral end portion, and the connected portion of the first surface and the second surface is extended, in such a manner that a spacing distance from the first lateral end portion or the second lateral end portion is gradually decreased, in a direction toward the top end portion;

or alternatively, the first trace is a straight line connecting between the first lateral end portion and the second lateral end portion; the notch comprises a circular arc surface facing toward the first lateral end portion or the second lateral end portion, and a corresponding chord length of the circular arc surface is gradually decreased from the bottom end portion to the top end portion.

5. The LED lighting base according to claim 1, characterized in that the first trace and the second trace perpendicularly intersect;

or, the first trace and the second trace are coplanar and perpendicularly intersect.

6. A light-emitting diode (LED) lighting bead, characterized by comprising:

the LED lighting base according to claim 1, one of the two pin portions of the first pin pair arranged along the first trace being a signal input terminal, another being a signal output terminal;

the LED chip assembly, the LED chip assembly being mounted in the recessed compartment of the LED lighting base and electrically connected to the multiple solder pad portions;

the LED encapsulation resin, the LED encapsulation resin being filled in the recessed compartment and hermetically encapsulating the LED chip assembly.

7. The LED lighting bead according to claim 6, characterized in that the LED chip assembly comprises a driving chip and at least one kind of light-emitting chip, and the driving chip is electrically connected to the light-emitting chip.

8. A light-emitting diode (LED) lighting strip, character-ized by comprising:

at least two of the LED lighting beads according to claim 6; the at least two LED lighting beads being arranged at intervals along the second trace;

a conductive line assembly, the conductive line assembly comprising at least two signal lines, in which an end of one of the signal lines is configured to be connected to an external signal source and another end is connected to the signal input terminal of one of the LED lighting beads for input signals to the LED lighting bead; two adjacent LED lighting beads being connected by another one of the signal lines for cascade transmission of the signals between the LED lighting beads.

9. The LED lighting strip according to claim 8, charac-terized in that a spacing distance is present between the signal lines and the insulation housing;

and/or, the conductive line assembly further comprises a power line; the power line being electrically connected to the pin portions arranged along the second trace.

\* \* \* \* \*